United States Patent
Floerke et al.

(10) Patent No.: US 9,725,963 B2
(45) Date of Patent: Aug. 8, 2017

(54) TRANSMISSION LINE FOR WIRED PIPE

(71) Applicants: Helmut Dieter Floerke, Celle (DE); Ingo Roders, Seelze (DE); Stephan Mueller, Lower Saxony (DE)

(72) Inventors: Helmut Dieter Floerke, Celle (DE); Ingo Roders, Seelze (DE); Stephan Mueller, Lower Saxony (DE)

(73) Assignee: BAKER HUGHES INCORPORATED, Houston, TX (US)

( * ) Notice: Subject to any disclaimer, the term of this patent is extended or adjusted under 35 U.S.C. 154(b) by 1124 days.

(21) Appl. No.: 13/850,384

(22) Filed: Mar. 26, 2013

(65) Prior Publication Data

US 2014/0291015 A1 Oct. 2, 2014

(51) Int. Cl.
*H05K 9/00* (2006.01)
*E21B 17/02* (2006.01)
*E21B 17/00* (2006.01)
*E21B 17/10* (2006.01)

(52) U.S. Cl.
CPC .......... *E21B 17/028* (2013.01); *E21B 17/003* (2013.01); *E21B 17/1035* (2013.01); *H05K 9/0098* (2013.01); *Y10T 29/49117* (2015.01)

(58) Field of Classification Search
None
See application file for complete search history.

(56) References Cited

U.S. PATENT DOCUMENTS

| 6,590,161 | B1 | 7/2003 | Bolouri-Saransar |
| 6,982,384 | B2 * | 1/2006 | Hall .................. E21B 17/003 174/102 R |
| 7,040,003 | B2 * | 5/2006 | Hall .................. E21B 17/028 29/602.1 |
| 2004/0020642 | A1 * | 2/2004 | Vinegar .................. B09C 1/02 166/245 |
| 2004/0118591 | A1 | 6/2004 | Bufanda et al. |
| 2006/0021799 | A1 | 2/2006 | Hall et al. |
| 2008/0041575 | A1 | 2/2008 | Clark et al. |
| 2010/0111592 | A1 | 5/2010 | Hassell et al. |
| 2010/0126752 | A1 * | 5/2010 | Watanabe ............ H05K 9/0098 174/102 D |

(Continued)

FOREIGN PATENT DOCUMENTS

WO 2012015868 A2 2/2012

OTHER PUBLICATIONS

"Very High-Speed Drill String Communications Network—Intellipipe"; retrieved on Mar. 26, 2013 from www.netl.doe.gov/kmd/cds/disk11/pdfs/NT41229.pdf; p. 1-6.

(Continued)

*Primary Examiner* — Courtney Smith
*Assistant Examiner* — Jessey R Ervin
(74) *Attorney, Agent, or Firm* — Cantor Colburn LLP

(57) ABSTRACT

The transmission line for wired pipe applications includes an inner conductor, an insulating material surrounding the inner conductor, the insulating material having an initial outer diameter, and a wire channel surrounding the insulating material and the inner conductor for at least a portion of a length of the transmission line. The wire channel is formed from at least two profiles forced together to compress the insulating material such that it has a final outer diameter that is less than the initial outer diameter.

19 Claims, 7 Drawing Sheets

(56) References Cited

U.S. PATENT DOCUMENTS

2013/0292154 A1* 11/2013 Aoyama ............ B60R 16/0215
                                                      174/105 R
2013/0306346 A1* 11/2013 Izawa ................ H02G 3/0468
                                                      174/102 R

OTHER PUBLICATIONS

Notification of Transmittal of the International Search Report and the Written Opinion of the International Searching Authority, or the Declaration; PCT/US2014/031808; Jul. 17, 2014 9 PAGES.

* cited by examiner

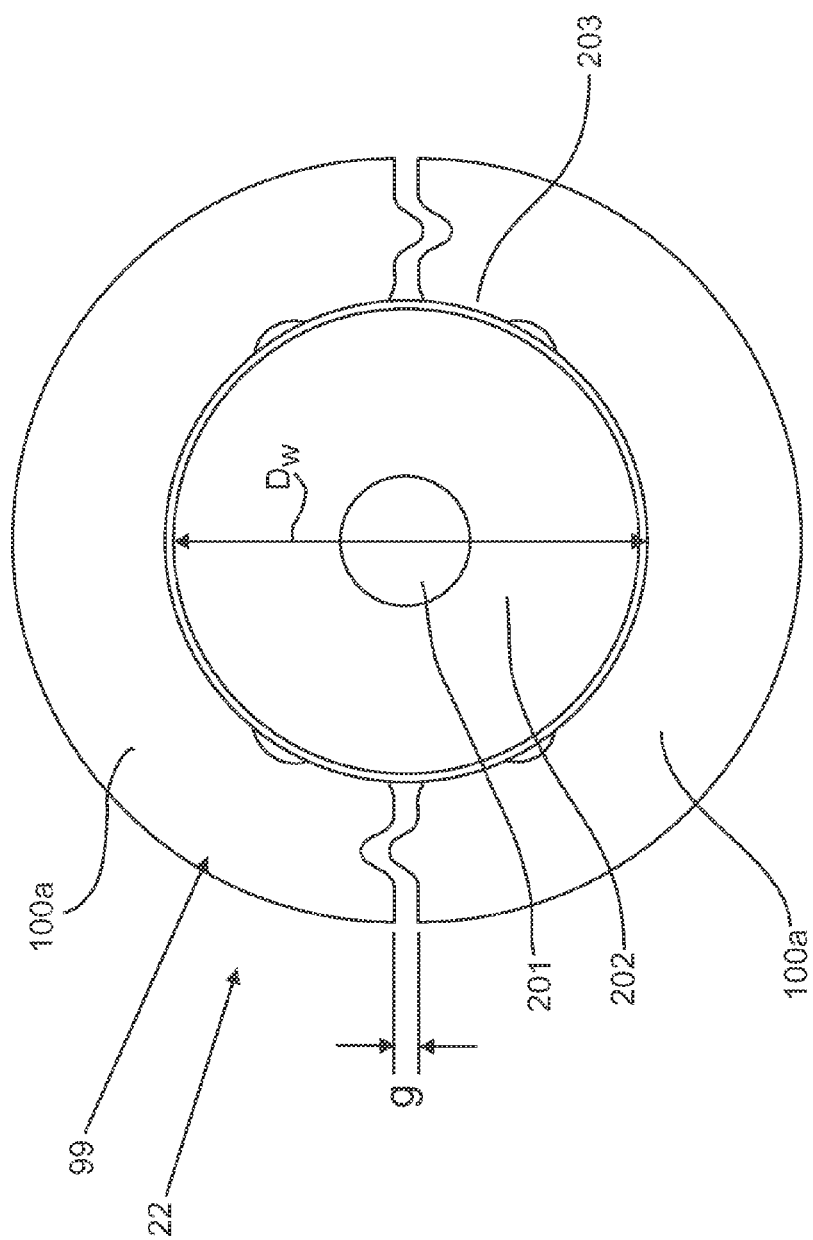

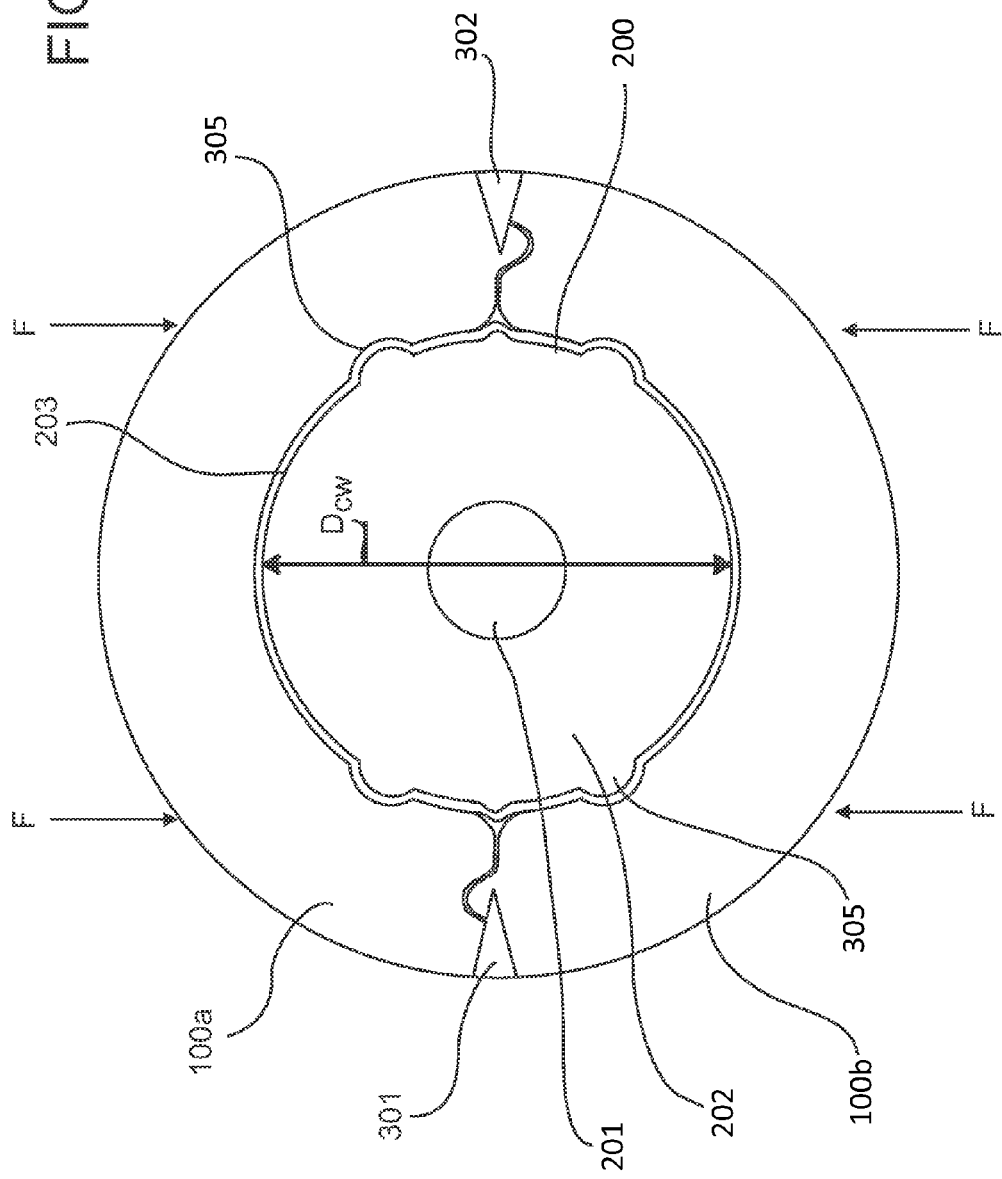

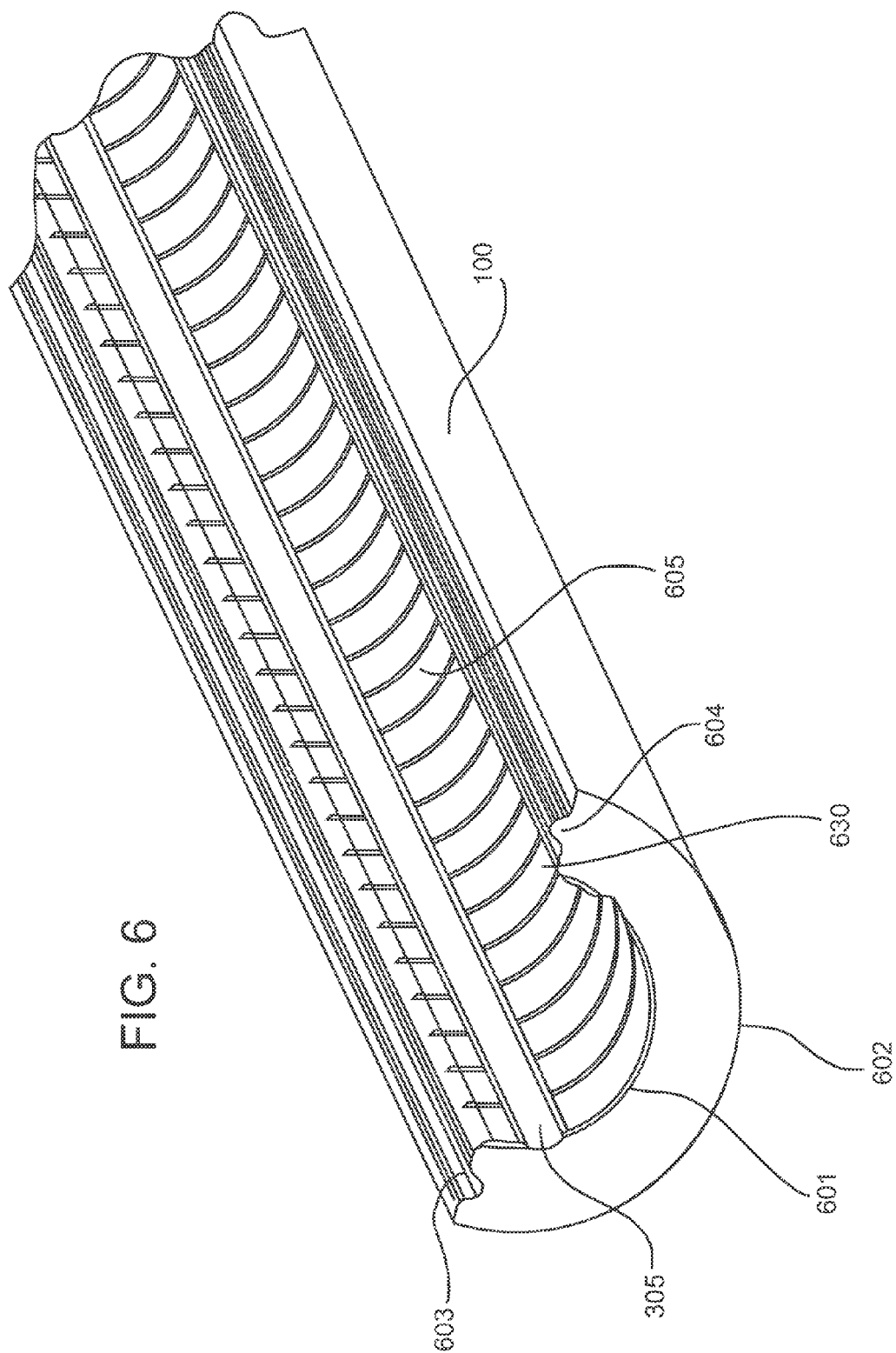

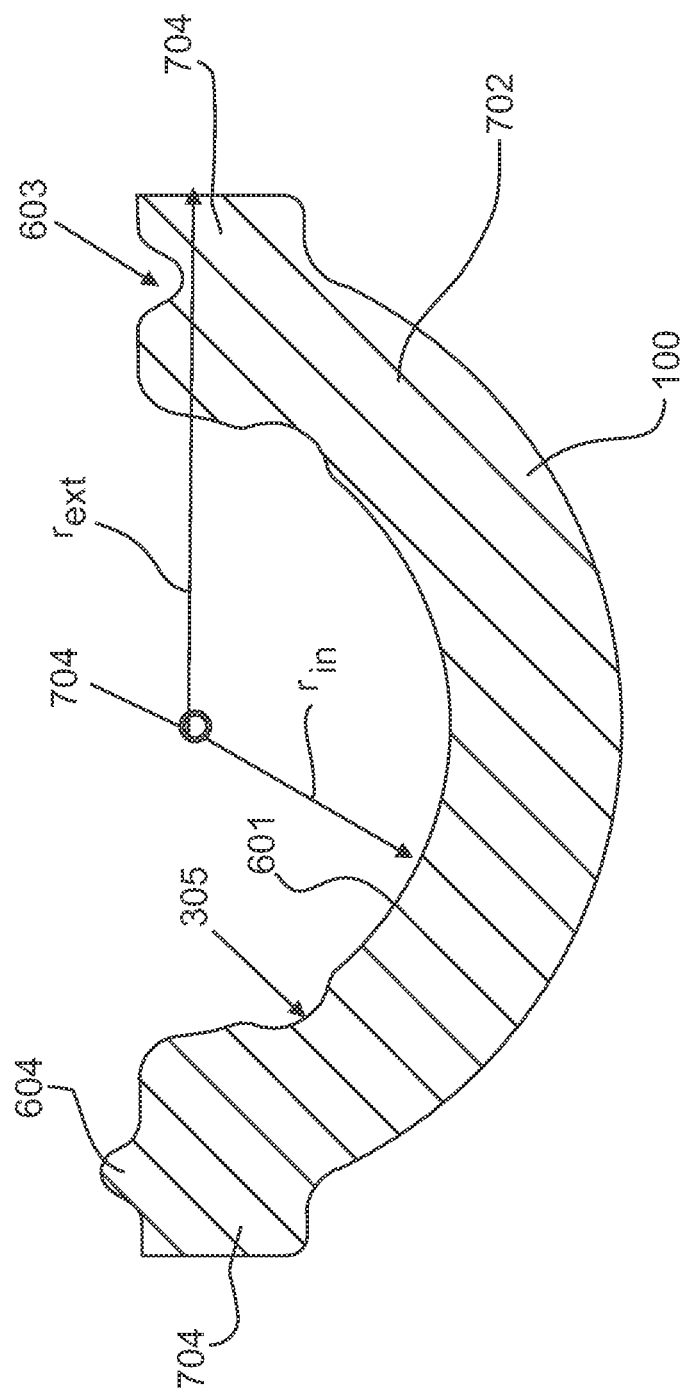

TRANSMISSION LINE FOR WIRED PIPE

BACKGROUND

During subterranean drilling and completion operations, a pipe or other conduit is lowered into a borehole in an earth formation during or after drilling operations. Such pipes are generally configured as multiple pipe segments to form a "string", such as a drill string or production string. As the string is lowered into the borehole, additional pipe segments are coupled to the string by various coupling mechanisms, such as threaded couplings.

Pipe segments can be connected with tool joints that include a threaded male-female configuration often referred to as a pin-box connection. The pin-box connection includes a male member, i.e., a "pin end" that includes an exterior threaded portion, and a female member, i.e., a "box end", that includes an interior threaded portion and is configured to receive the pin end in a threaded connection Various power and/or communication signals may be transmitted through the pipe segments via a "wired pipe" configuration. Such configurations include electrical, optical or other conductors extending along the length of selected pipe segments. The conductors are operably connected between pipe segments by a variety of coupling configurations.

Some wired pipe configurations include a transmission device mounted on the tip of the pin end as well as in the box end. The transmission device, or "coupler," can transmit power, data or both to an adjacent coupler. The coupler in the pin end might be connected via a transmission line to the coupler in the box end.

BRIEF DESCRIPTION

Disclosed herein is a wired pipe system that includes a wired pipe segment having a first end and a second end, a first coupler in the first end and a second coupler in the second end and a transmission line disposed in the wired pipe segment between the first and second ends. The transmission line includes an inner conductor, an insulating material surrounding the inner conductor, the insulating material having an initial outer diameter, and a wire channel surrounding the insulating material and the inner conductor for at least a portion of a length of the transmission line. The wire channel is formed from at least two profiles forced together to compress the insulating material such that it has a final outer diameter that is less than the initial outer diameter.

Also disclosed is a method of forming a wired pipe transmission line system. The method includes: providing an assembly that includes an inner conductor surrounded by an insulating material; providing at least two profiles, each profile having an inner surface and an outer surface and being semi-cylindrical; arranging the at least two of the profiles about the assembly such that a gap exists between the at least two profiles; and forcing the at least two profiles together to close the gap and compress the insulating material.

Also disclosed is a transmission line for use in a wired pipe communication system. The transmission line includes an inner conductor, an insulating material surrounding the inner conductor, the insulating material having an initial outer diameter, and a wire channel surrounding the insulating material and the inner conductor for at least a portion of a length of the transmission line. The wire channel is formed from at least two profiles forced together to compress the insulating material such that it has a final outer diameter that is less than the initial outer diameter.

BRIEF DESCRIPTION OF THE DRAWINGS

The following descriptions should not be considered limiting in any way. With reference to the accompanying drawings, like elements are numbered alike:

FIG. 4 shows a cross-sectional view of a transmission line according to one embodiment, prior to joining;

FIG. 5 shows a cross-sectional view of the transmission line of FIG. 5 after the profiles have been forced together to form a wire channel FIG. 6 shows a perspective view of one embodiment of a profile; and FIG. 7 shows a cross-section view of another embodiment of a profile.

DETAILED DESCRIPTION

A detailed description of one or more embodiments of the disclosed system, apparatus and method are presented herein by way of exemplification and not limitation with reference to the Figures.

As described above, the couplers in a wired pipe system are electrically connected via a transmission line. Embodiments herein are directed to transmission lines that can be used in a wired pipe system and examples of how such transmissions lines may be formed. In one or more of the embodiments disclosed herein, the transmission line is capable of withstanding one or more loads, as tension, compression and torsion and superimposed dynamic accelerations typically present in downhole tools during drilling. In one embodiment, the transmission line consists of a wire channel made of two or more outer segments (profiles), and a wire (one of coaxial cable, twisted pair wires, individual wires) enclosed in the profiles. The profiles can include mating features that can be disposed in one or more different locations on the profile. Further, the profiles can include either interference features to promote an interference fit between the profiles and the wire.

Figure 1:
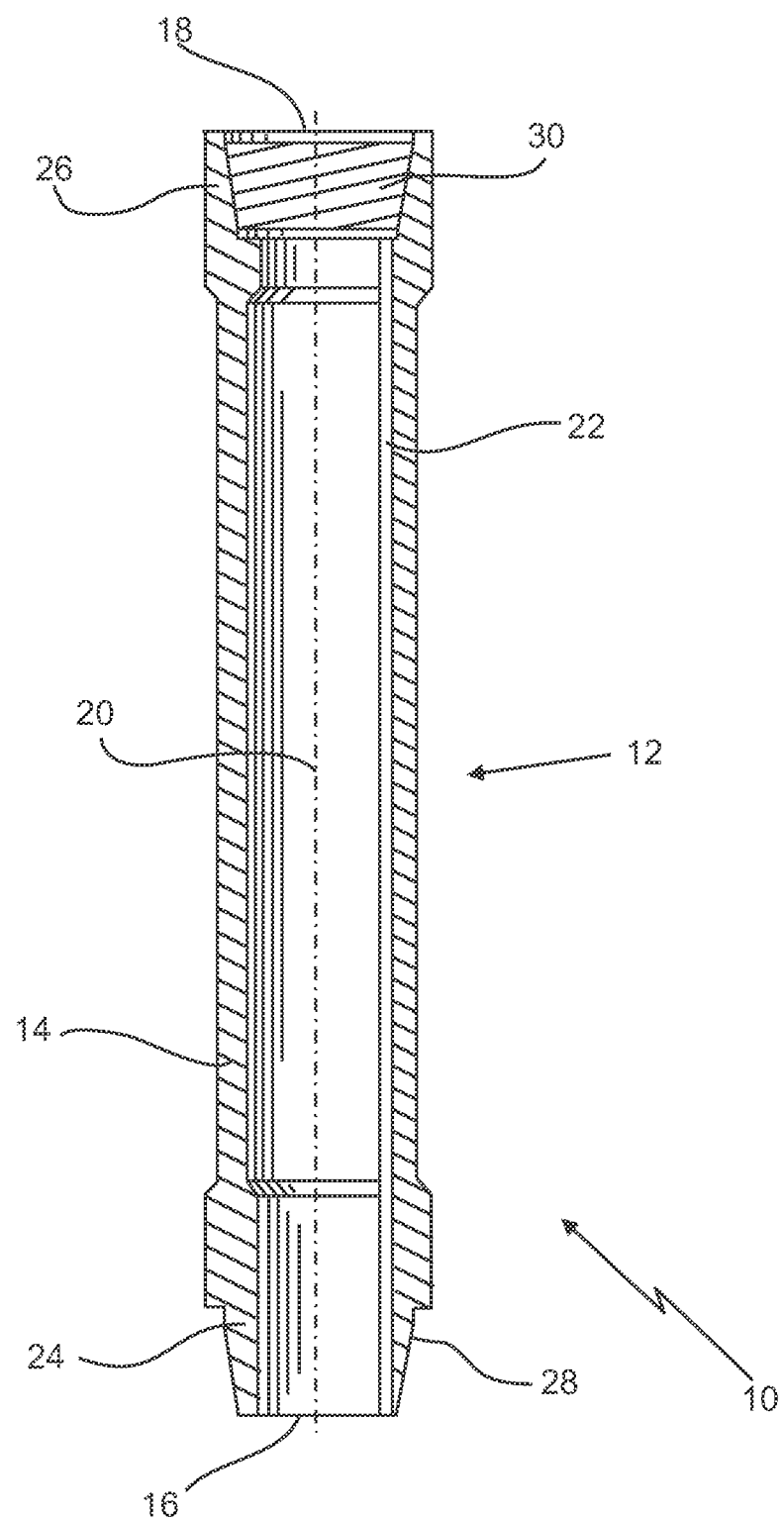
FIG. 1 depicts an exemplary embodiment of a wired pipe segment of a well drilling and/or logging system.

Referring to FIG. 1, an exemplary embodiment of a portion of a well drilling, logging and/or production system 10 includes a conduit or string 12, such as a drillstring or production string, that is configured to be disposed in a borehole for performing operations such as drilling the borehole, making measurements of properties of the borehole and/or the surrounding formation downhole, or facilitating gas or liquid production.

For example, during drilling operations, drilling fluid or drilling "mud" is introduced into the string 12 from a source such as a mud tank or "pit" and is circulated under pressure through the string 12, for example via one or more mud pumps. The drilling fluid passes into the string 12 and is discharged at the bottom of the borehole through an opening in a drill bit located at the downhole end of the string 12. The drilling fluid circulates uphole between the string 12 and the borehole wall and is discharged into the mud tank or other location.

The string 12 may include at least one wired pipe segment 14 having an uphole end 18 and a downhole end 16. As described herein, "uphole" refers to a location near the point where the drilling started relative to a reference location when the segment 14 is disposed in a borehole, and "downhole" refers to a location away from the point where the drilling started along the borehole relative to the reference location. It shall be understood that the uphole end 18 could be below the downhole end 16 without departing from the scope of the disclosure herein.

At least an inner bore or other conduit 20 extends along the length of each segment 14 to allow drilling mud or other fluids to flow therethrough. At least one transmission line 22 is located within the wired segment 14 to provide protection for electrical, optical or other conductors which can be part of the transmission line to be disposed along the wired segment 14. In one embodiment, the transmission line 22 is a coaxial cable. In another embodiment, the transmission line 22 is formed of any manner of carrying power or data, including, for example, a twisted pair. In the case where the transmission line 22 is a coaxial cable it may include an inner conductor surrounded by a dielectric material. The coaxial cable may also include a shield layer that surrounds the dielectric. The transmission line 22, as described further below, may be disposed in a wire channel that may be formed, for example, by a rigid or semi-rigid tube of a conductive or non-conductive material.

The segment 14 includes a downhole connection 24 and an uphole connection 26. The segment 14 is configured so that the uphole connection 26 is positioned at an uphole location relative to the downhole connection 24. The downhole connection 24 includes a male connection portion 28 having an exterior threaded section, and is referred to herein as a "pin end" 24. The uphole connection 26 includes a female connection portion 30 having an interior threaded section, and is referred to herein as a "box end" 26.

The pin end 24 and the box end 26 are configured so that the pin end 24 of one wired pipe segment 14 can be disposed within the box end 26 of another wired pipe segment 14 to effect a fixed connection therebetween to connect the segment 14 with another adjacent segment 14 or other downhole component. It shall be understood that a wired pipe segment may consist of several (e.g. three) segments. In one embodiment, the exterior of the male coupling portion 28 and the interior of the female coupling portion 30 are tapered. Although the pin end 24 and the box end 26 are described as having threaded portions, the pin end 24 and the box end 26 may be configured to be connected using any suitable mechanism, such as bolts or screws or an interference fit.

In one embodiment, the system 10 is operably connected to a downhole or surface processing unit which may act to control various components of the system 10, such as drilling, logging and production components or subs. Other components include machinery to raise or lower segments 14 and operably couple segments 14, and transmission devices. The downhole or surface processing unit may also collect and process data generated or transmitted by the system 10 during drilling, production or other operations.

As described herein, "drillstring" or "string" refers to any structure or carrier suitable for lowering a tool through a borehole or connecting a drill bit to the surface, and is not limited to the structure and configuration described herein. For example, a string could be configured as a drillstring, hydrocarbon production string or formation evaluation string. The term "carrier" as used herein means any device, device component, combination of devices, media and/or member that may be used to convey, house, support or otherwise facilitate the use of another device, device component, combination of devices, media and/or member. Exemplary non-limiting carriers include drill strings of the coiled tube type, of the jointed pipe type and any combination or portion thereof Other carrier examples include casing pipes, wirelines, wireline sondes, slickline sondes, drop shots, downhole subs, BHA's and drill strings.

Figure 2:
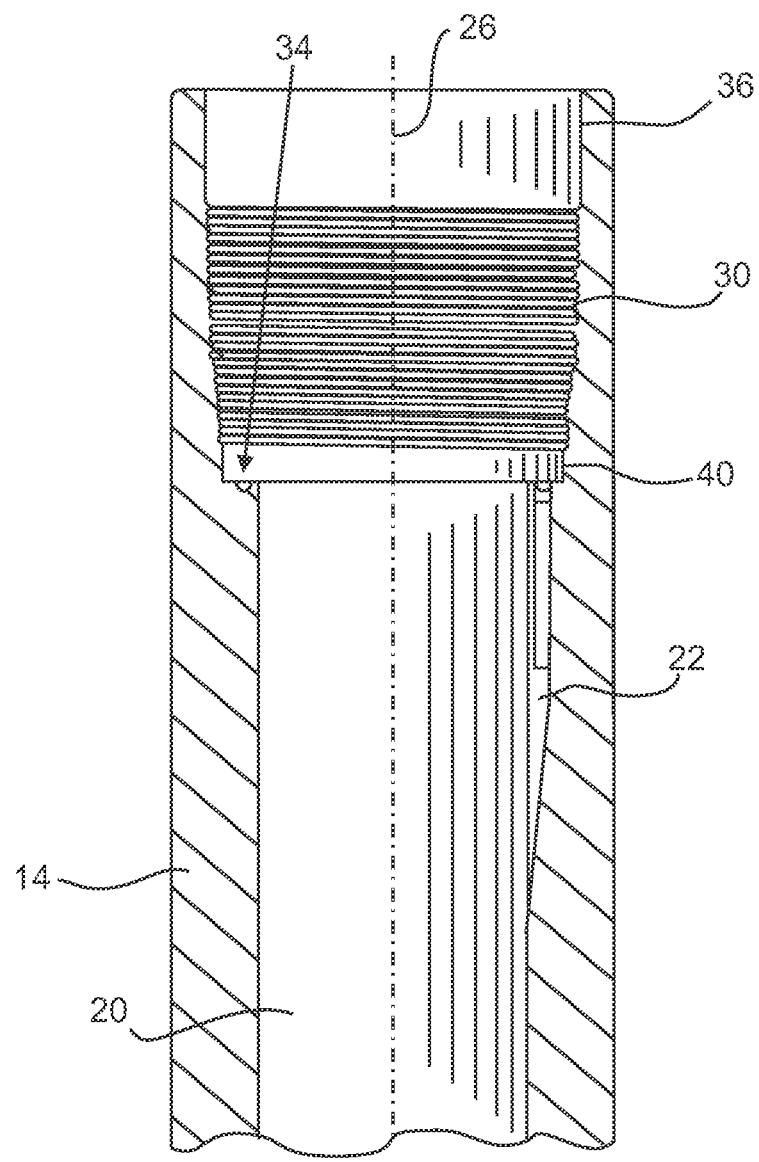
FIG. 2 depicts an exemplary embodiment of a box end of the segment of FIG. 1.
Figure 3:
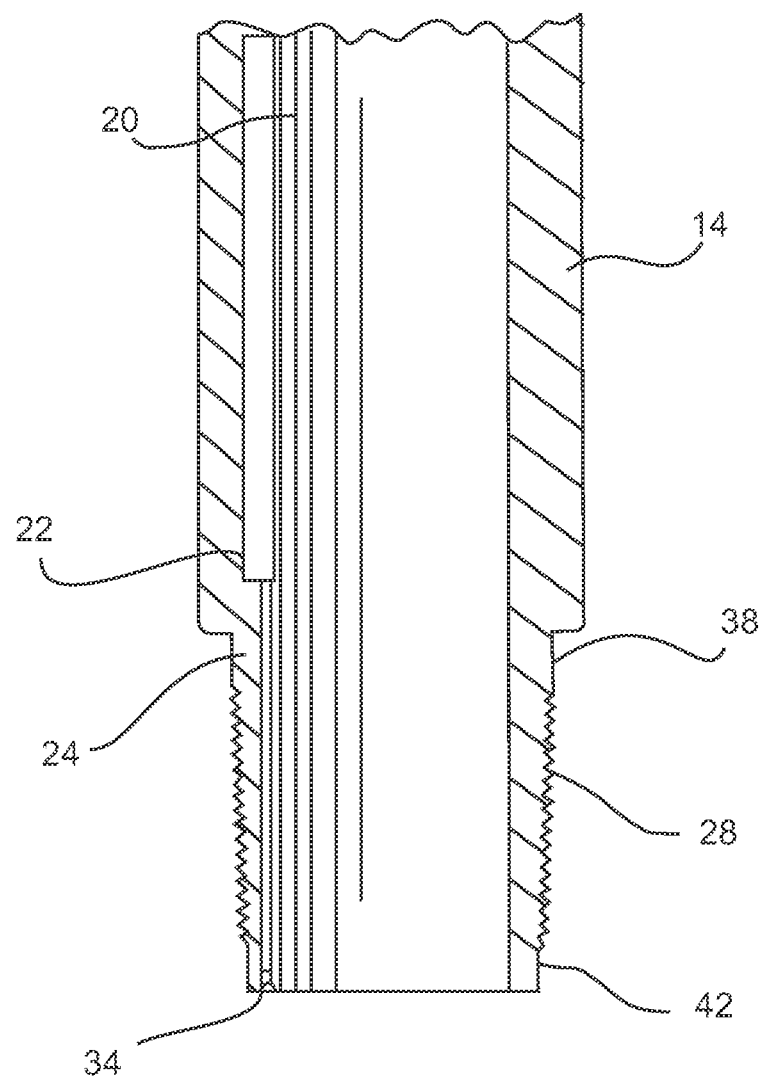
FIG. 3 depicts an exemplary embodiment of a pin end of the segment of FIG. 1.

Referring to FIGS. 2 and 3, the segment 14 includes at least one transmission device 34 (also referred to as a "coupler" herein) disposed therein and located at the pin end 24 and/or the box end 26. The transmission device 34 is configured to provide communication of at least one of data and power between adjacent segments 14 when the pin end 24 and the box end 26 are engaged. The transmission device 34 may be of any suitable type, such as an inductive coil, capacitive or direct electrical contacts, resonant coupler, or an optical connection ring. The coupler may be disposed at the inner or outer shoulder or in between. It shall be understood that the transmission device 34 could also be included in a repeater element disposed between adjacent segments 14 (e.g., within the box end). In such a case, the data/power is transmitted from the transmission device 34 in one segment 14, into the repeater. The signal may then be passed "as is," amplified, and/or modified in the repeater and provided to the adjacent segment 14.

Regardless of the configuration, it shall be understood that each transmission device 34 can be connected to one or more transmission lines 22. Embodiments disclosed herein are directed to how such transmission lines 22 can be formed.

In more detail, and referring now to FIG. 4, the illustrated transmission line 22 includes a wire channel formed of two or more profiles 100. As shown, the two profiles 100a and 100b are sized and arranged to fit together to mate and form the wire channel 99. The profiles 100, when coupled to form the wire channel 00, serve to protect the wire 200 disposed within it. The profiles 100 can be formed of steel or a steel alloy in one embodiment. Of course, other materials could be used to form the profiles 100.

In the illustrated embodiment, the wire 200 is shown as a coaxial cable that includes an inner conductor 201 surrounded by an insulating layer such as dielectric layer 202. It should be understood that the wire 200 could be a twisted pair or an individual wire that is surrounded by an insulating layer.

The inner conductor 201 may be formed of a solid or braided metallic wire. The insulating layer, for example dielectric layer 202, surrounds the inner conductor 201 for most of the length of the inner conductor 201. The illustrated transmission line 22 can include a shield layer 203 that surrounds the dielectric layer 202. The shield layer 203 can be formed of a highly conductive material such as copper in one embodiment and can be a braided or solid layer of material. In one embodiment, the shield layer 203 may be in direct contact with the wire channel 99. In another embodiment, the shield layer 203 may be physically separated from the wire channel 99 by, for example, an insulating layer. Of course, in such a configuration, the wire channel 99 and the shield layer 203 may be electrically coupled to one another.

The combination of the dielectric layer 202 and the inner conductor 201 can be formed in any known manner. In one embodiment, the combination is formed such that the dielectric layer 202 and the inner conductor 201 are tightly bound.

Regardless of how formed, the wire 200 may be characterized as having a diameter, $D_w$. In the illustrated embodiment, $D_w$ is measured from the the outer edge of the dielectric layer 202. It shall be understood, however, that in one embodiment, $D_w$ is measured from the outer edge of the shield layer 203 and in another embodiment, $D_w$ can be measured from any other layers that surround the wire and are not part of the profiles 100

In one embodiment, $D_w$ is greater than the interior diameter of the wire channel 99. The interior diameter is not realized, however, until the profiles 100 are brought together. The difference in inner diameter and $D_w$ is illustrated in FIG. 4 by the gap, g, between the profiles 100. In one embodiment, the difference between the interior diameter and $D_w$ is equal to g With reference now to FIGS. 4 and 5, one or more forces F can be applied to drive separated profiles 100a, 100b (as shown in FIG. 4) together to form the completed transmission line 22 (as shown in FIG. 5). As illustrated in FIG. 5, the profiles 100 are coupled together by welds 301, 302. It will be understood from the teachings herein, profiles could be held together in other manners including, without limitation, by gluing them together or surrounding them by a fastening device.

The wire 200 has a compressed diameter relative to the D, that is shown as $D_{cw}$ in FIG. 5. The compression due to the joining of the two separate profiles 100 results in the substantially tubular wire channel 99 and an interference fit between the wire 200 and the wire channel 99. In the illustrated embodiment, the profiles 100 include one or more optional indentations 305 formed on their inner surfaces. These indentations 305 may provide room for the dielectric layer 202 to expand into as the profiles 100 are forced together. In this manner, in one embodiment, an interference fit that keeps the wire 200 and the wire channel 99 from moving relative to one another during operation of a wired pipe system in a down hole environment may be created without having to deform the wire channel 99.

FIG. 6 illustrates an example profile 100 that may be utilized in the formation of a transmission line 22. As illustrated, the profile 100 is generally a semi-cylindrical member that includes an inner surface 601 and an outer surface 602 joined by a connecting surface 630. The inner and outer surfaces 601, 602 are generally arcuate and semi-circular in shape. As discussed above, when mated with another profile 100, a generally cylindrical wire channel may be formed that surrounds and protects a wire.

In more detail, the illustrated profile 100 includes optional mating features 603, 604 formed in/on the connecting surface 630 that mate with complementary mating features in another profile. As illustrated, the mating features 603 and 604 are shown, respectively, as a groove and a nose. When mated with another profile (as shown, for example, in FIG. 5), the groove mating feature 603 of one profile will receive the nose mating feature 604 of the other profile. One of ordinary skill will realize that the particular shape and arrangement of the mating features 603, 604 can be varied. Further, the additional mating features can be added.

The illustrated profile 100 also includes indentations 305 formed on the inner surface 601. As illustrated, the indentations 305 are shown as a groove but the particular shape can be varied. Further, as illustrated, the illustrated groove indentations 305 travel in a generally axial direction along the length of the profile 100. Of course, the direction could be altered and could, for example, spiral along the length of the profile 100.

Optionally, the profile 100 can also include, as illustrated, one or more interference features 605. As illustrated, the interference features 605 are raised radial members. The direction and shape of these members can be varied from that shown in FIG. 6. In one embodiment, the interference features 605 could be grooves. It shall be understood that, regardless of whether the interference features are raised or are grooves, the indentations 305 could be implemented as a raised feature as opposed to the groove shown in FIG. 6.

In the above description, the outer surface 602 has been shown as being generally semi-circular. It shall be understood that the outer surface 602 could include one or more outwardly extending projections 704 that carry the mating elements 603, 604 as is shown if FIG. 7. In FIG. 7 the outwardly extending projections extend (radius $r_{ext}$) further from a center of curvature 720 than an internal radius ($r_{in}$) that extends from the center of curvature 720 to the inner surface 601.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof Therefore, it is intended that the invention not be limited to the particular embodiment disclosed as the best mode contemplated for carrying out this invention, but that the invention will include all embodiments falling within the scope of the appended claims.

What is claimed is:

1. A wired pipe system comprising:
a pipe segment having a first end and a second end;
a first coupler in the first end and a second coupler in the second end; and
a transmission line disposed in the pipe segment between the first and second ends, the transmission line comprising:
an inner electrical conductor;
an electrical insulating material surrounding the inner conductor along a majority of a length of the inner electrical conductor, the insulating material having an initial outer diameter; and
a wire channel surrounding the insulating material and the inner conductor for at least a portion of a length of the transmission line, the wire channel being formed from at least two profiles forced together to compress the insulating material by the force applied to the profiles such that it has a final outer diameter that is less than the initial outer diameter.

2. The wired pipe system of claim 1, wherein at least one of the profiles includes an inner surface and an outer surface, the inner surface being arcuate and having indentations formed in it.

3. The wired pipe system of claim 2, wherein the indentations extend axially along at least a portion of a length of the at least one of the profiles.

4. The wired pipe system of claim 2, wherein the indentations are arranged circumferentially around the insulating material along at least a portion of a length of the at least one of the profiles.

5. The wired pipe system of claim 1, wherein at least one of the profiles includes an inner surface and an outer surface, the inner surface being arcuate and having interference features formed on it and that extend from the inner surface.

6. A wired pipe system comprising:
a pipe segment having a first end and a second end;
a first coupler in the first end and a second coupler in the second end; and
a transmission line disposed in the pipe segment between the first and second ends, the transmission line comprising:
   an inner conductor;
   an insulating material surrounding the inner conductor, the insulating material having an initial outer diameter; and
a wire channel surrounding the insulating material and the inner conductor for at least a portion of a length of the transmission line, the wire channel being formed from at least two profiles forced together to compress the insulating such that it has a final outer diameter that is less than the initial outer diameter;
wherein at least one of the profiles includes an inner surface and an outer surface, the inner surface being arcuate and having interference features formed on it and that extend from the inner surface; and
wherein the interference features extend axially along at least a portion of a length of the at least one of the profiles.

7. The wired pipe system of claim 5, wherein the interference features are arranged circumferentially around the insulating material along at least a portion of a length of the at least one of the profiles.

8. The wired pipe segment of claim 1, wherein the transmission line further includes:
   a shield layer disposed between the insulating material and the wire channel.

9. The wired pipe segment of claim 1, at least one of the profiles includes one or more mating features shaped and arranged to mate with a corresponding mating feature on another profile.

10. The wired pipe segment of claim 9, wherein the profiles include outwardly extending projections that extend from an outer surface of the profiles and that carries one or more of the mating features.

11. A method of forming a wired pipe transmission line system comprising:
   providing an assembly that includes an inner electical conductor surrounded by an electrical insulating material;
   providing at least two profiles, each profile having an inner surface and an outer surface and being semi-cylindrical;
   arranging the at least two of the profiles about the assembly such that a gap exists between the at least two profiles;
   forcing the at least two profiles together to close the gap and compress the insulating material;
   welding one profile to another profile after the gap between them has been closed.

12. The method of claim 11, wherein at least one of the profiles includes an arcuate inner surface having indentations formed in it.

13. The method of claim 12, wherein the indentations extend axially along at least a portion of a length of the at least one of the profiles.

14. The method of claim 12, wherein the indentations are arranged circumferentially around the inner surface.

15. The method of claim 11, wherein at least one of the profiles includes an arcuate inner surface having interference features formed on it.

16. The method of claim 15, wherein the interference features are arranged circumferentially around the inner surface or extend axially along at least a portion of a length of the at least one of the profiles.

17. The method of claim 11, wherein providing an assembly includes providing an assembly that includes a shield layer surrounding the insulating material.

18. The method of claim 17, wherein providing an assembly includes providing an assembly that includes an insulating layer surrounding the shield layer.

19. A transmission line for use in a wired pipe communication system, the transmission line comprising:
   an inner electrical conductor;
   an electrical insulating material surrounding the inner electrical conductor along a majority of a length of the inner electrical conductor, the electrical insulating material having an initial outer diameter; and
   a wire channel surrounding the electrical insulating material and the inner electrical conductor for at least a portion of a length of the transmission line, the wire channel formed from two profiles forced together to compress the insulating material by the force applied to the profiles such that it has a final outer diameter that is less than the initial outer diameter.

* * * * *